March 10, 1970 R. E. WERNER 3,500,246

VARIABLE FREQUENCY OSCILLATOR WITH CONSTANT AMPLITUDE OUTPUT

Filed July 26, 1968

INVENTOR
RICHARD E. WERNER

BY Edward J Norton

ATTORNEY

United States Patent Office
3,500,246
Patented Mar. 10, 1970

3,500,246

VARIABLE FREQUENCY OSCILLATOR WITH CONSTANT AMPLITUDE OUTPUT

Richard E. Werner, Trenton, N.J., assignor to RCA Corporation, a corporation of Delaware Filed July 26, 1968, Ser. No. 747,909
Int. Cl. H03b 3/02, 5/26
U.S. Cl. 331—140 10 Claims

ABSTRACT OF THE DISCLOSURE

A technique for providing a substantially constant amplitude output voltage over the entire frequency range of a variable frequency oscillator of the type having an automatic gain control feedback circuit. The constant output voltage is obtained by adjusting the relative magnitudes of voltage signals derived from the oscillator output and from the gain control feedback circuit and differentially combining the adjusted signals to form the output voltage.

BACKGROUND OF THE INVENTION

This invention relates to a variable frequency, signal generator whose output signal amplitude remains substantially constant over the frequency range of the oscillator.

Variable frequency audio signal generators have found wide application in the electronic signal generation and processing field. A problem which has engaged the art, is that of providing a wide range variable frequency audio generator, with an output voltage which is independent of unbalances in the tuning circuits. This problem is particularly acute in any application where a variable frequency oscillator is required, whose output voltage amplitude is independent of the frequency adjustment. This is especially true where it is desirable to make accurate frequency response measurements.

To achieve low distortion in conventional resistance-capacitance tuned audio signal generators, a means must be employed to insure that the loop gain is maintained exactly at unity, for signal levels within the linear range of the transfer characteristics of the generator's feedback amplifier. Unavoidable imbalances occur in the frequency selective feedback network. Frequency response and phase variations in the amplifier itself, cause variations in the loop gain for different frequency control settings. One common technique for stabilizing the loop gain, is to employ a light bulb or a thermistor type element in the feedback circuit. The bulb or thermistor changes resistance with temperature which in turn is a function of the signal level applied to it. The circuitry is arranged, so that the change in resistance, varies the feedback in a manner to restore unity gain to the overall loop. Unfortunately, a decrease in signal level is required in order to operate the device, so as to increase an otherwise insufficient gain. Similarly, an increase in signal level is required to operate the device to decrease an otherwise excessive gain. In a typical wide range variable frequency oscillator, the output level may change by a decibel or more with changes in the frequency control settings.

The change in output level can be reduced by several means which have been employed heretofore in the art. The output signal can be amplified, rectified, filtered, reamplified as necessary. The resultant D.C. signal is then applied to the light bulb, thermistor, or photoconductor circuit used to control the loop gain, thereby improving the effectiveness of the circuit. Alternatively an automatic gain controlled (A.G.C.) amplifier, compressor or limiter may be added to the output circuit to regulate the output voltage. Unfortunately, each of these methods requires that the control action be sufficiently slowed, so that the gain will not follow the signal waveform, and thus introduce distortion at low frequencies. The greater the effectiveness of the control the slower must be its response for a given distortion. As a consequence, a highly effective system of this type is characterized by a response, which is so slow that rapid tuning of the frequency control causes substantial variations in the output level. Even momentary cessation of oscillation occurs in some circuits. This is a great inconvenience when measuring the frequency characteristics of devices. A basic oscillator will a lightbulb or thermistor control element, which is sufficiently fast acting but limited in effectiveness, can be improved in effectiveness without slowing its action, by employing the circuitry of the invention herein disclosed.

It is therefore an object of the present invention to provide an improved oscillator having a substantially constant output amplitude over its full frequency range.

SUMMARY OF INVENTION

According to the present invention, the signals present on either side of an A.G.C. element of a conventional oscillator are connected to a signal amplitude difference determining circuit. The gain for each input of the difference circuit is appropriately adjusted to provide an output which is independent of the output variations inherent in the basic A.G.C. controlled oscillator circuit.

DESCRIPTION

Figure 1:
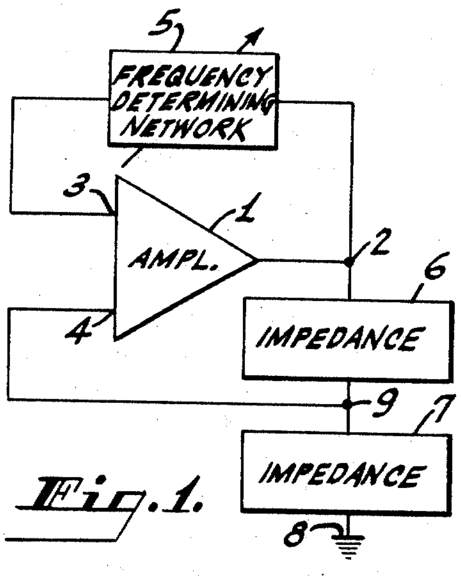
FIGURE 1 is a block diagram of a variable frequency oscillator system for use with the present invention.

If reference is made to FIGURE 1, there is shown a variable frequency feedback oscillator. The oscillator includes an amplifier 1 having a first output terminal 2 and two input terminals 3 and 4. The amplifier 1 is of the type that a signal at one input terminal will be amplified with phase inversion while a signal at the other input will be amplified without phase inversion. The network 5, which provides a controllable feedback signal having an amplitude and phase required to restrain oscillation to a desired frequency, is coupled between the output terminal 2 and input terminal 3. A signal dividing network comprising impedances 6 and 7 and ground point 8, is coupled to the output terminal 2. The signal developed at terminal 9 is fed back to input terminal 4 to stabilize the loop gain of the oscillator. To provide a proper gain stabilizing feedback signal to terminal 4 in response to signal changes at terminal 2, one of the impedances 6 and 7 is a variable impedance device. The variation of impedance of the device is such that, its impedance changes with temperature or illumination from a light source which in turn is a function of the signal level applied to the device. It is to be noted that the feedback oscillator of FIGURE 1 is indicative of the general structure of such devices. Several known oscillators such as the bridged T or Wien bridge oscillators may be utilized. Therefore, the particular impedance 6 or 7 to be made variable, and whether its variable impedance increases or decreases with applied signal, will depend upon the particular oscillator embodiment utilized for the circuit of FIGURE 1. That is, one of the impedances is selected to be variable with the signal applied, in the proper sense to restore unity gain to the overall loop for a particular direction of variation of the signal at terminal 2.

Figure 2:
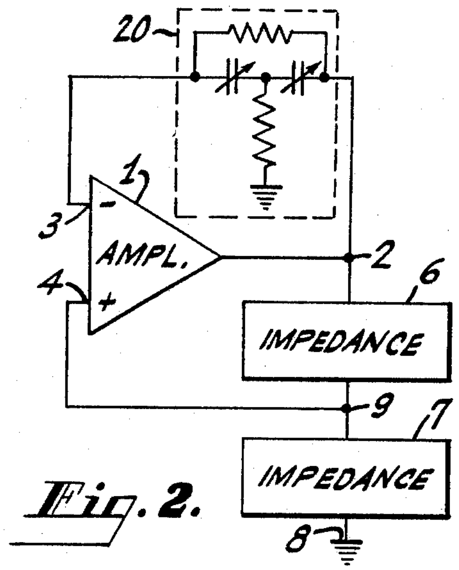
FIGURE 2 is a partial schematic and partial diagrammatic view of a first type of oscillator for use with the present invention.

For example, if a bridged T oscillator is used for the oscillator of FIGURE 1, the circuit would appear as shown in FIGURE 2. It is to be noted in the circuit of FIG. 2, that the frequency determining network denoted by dashed line box 20 provides a negative feedback signal to input terminal 3. That is, the feedback signal is applied to the phase-inverting input terminal 3. However, the gain stabilizing signal produced at terminal 9 provides a positive feedback signal to input terminal 4. That is, the feedback signal is applied to the non-phase-inverting input terminal. Therefore, if the output signal at terminal 2, increases, the proportion of positive feedback to terminal 4 must decrease to stabilize the loop gain of the oscillator. To accomplish this, the impedance 6 is made variable as a function of applied signal with a positive coefficient of variation, while the impedance 7 is a fixed value. A positive coefficient of variation is defined, as one producing an increase in impedance of the device in response to an increase in signal applied to the device. Alternatively, the impedance 7 may be made the variable impedance as a function of applied signal with a negative coefficient of variation, while the impedance 6 is a fixed value. A negative coefficient of variation is defined, as one producing a decrease in impedance of the device in response to an increasing signal applied to the device. For either configuration, an increase of the signal at terminal 2 will produce a reduction in the proportion of positive feedback signal to terminal 4. This occurs, since the increase in the signal at terminal 2 will alter the ratio impedance 7 with respect to the impedance 6.

Figures 3, 4:
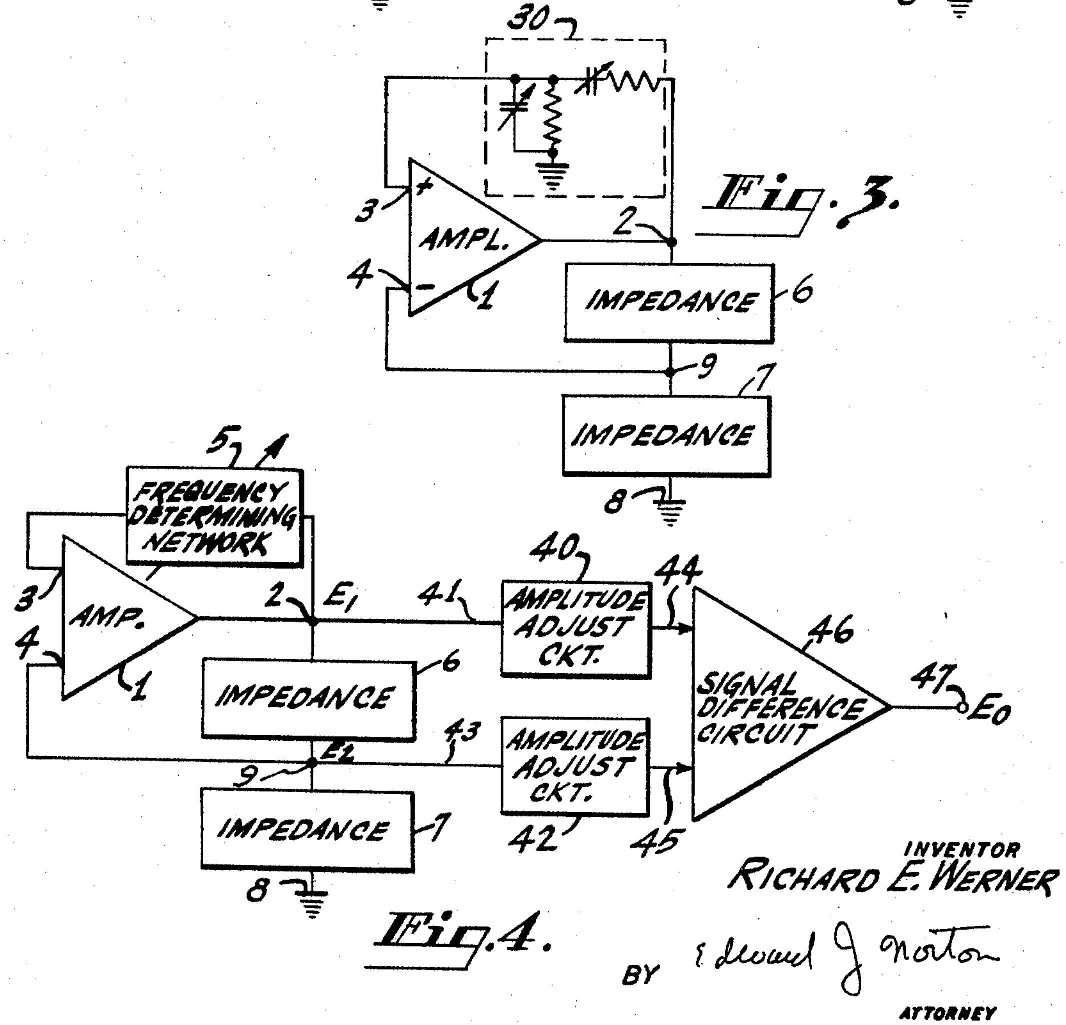
FIGURE 3 is a partial schematic and partial diagramatic view of a second type of oscillator for use with the present invention.
FIGURE 4 is a partial schematic and partial diagrammatic view of an oscillator system with the circuitry of the present invention.

By way of an additional example, if a Wien bridge type oscillator is used for the oscillator of FIGURE 1, the circuit would appear as shown in FIGURE 3. It is to be noted, in the circuit of FIGURE 3, that the frequency determining network, denoted by dashed box 30 provides a positive feedback signal to the input terminal 3. However, the gain stabilizing signal produced at terminal 9, provides a negative feedback to input terminal 4. Therefore, if the output signal at terminal 2 increases, the proportion of negative feedback to terminal 4 must increase to stabilize the loop gain of the oscillator. To accomplish this, the impedance 7 is made variable as a function of applied signal with a positive coefficient of variation, while the impedance 6 is a fixed value. Alternatively, the impedance 6 may be made the variable impedance, as a function of applied signal, with a negative coefficient of variation, while the impedance 7 is a fixed value.

The present invention will be explained with reference to FIGURE 4. FIGURE 4 shows a variable frequency oscillator of the type described above, in conjunction with the circuitry of the present invention. For purposes of simplicity and clarity of explanation of the present invention, the oscillator circuit of FIGURE 4 will be assumed to be of the bridged T type as shown in FIGURE 2, with the impedance 6 a positive coefficient variable impedance and impedance 7 a fixed impedance. It is to be understood however, that the principles of the present invention are applicable to other variable frequency feedback amplifiers with differing arrangements of the variable impedance device as discussed above.

In FIGURE 4, the oscillator has a frequency determining feedback network 5 coupled between terminals 2 and 3 of amplifier 1. A gain control network comprised of impedances 6 and 7 and ground terminal 8 is coupled to terminal 2, for feeding back a loop gain stabilizing signal to terminal 4 of amplifier 1. A first amplitude adjust circuit 40, is connected to terminal 2 by lead 41. A second amplitude adjust circuit 42, is connected to terminal 9 by lead 43. The outputs of amplitude adjust circuits 40 and 42, are connected by leads 44 and 45 respectively to a signal difference circuit 46. The output of the oscillator system is provided as the signal $E_0$ at terminal 47.

In operation of the circuit of FIGURE 4, a first output voltage of the oscillator is obtained as $E_1$ at terminal 2. The amplitude value of the voltage $E_1$ may vary by a decibel or more, for various settings of the frequency determining network 5. If the loop gain of the oscillator falls below unity, due to imbalance in the frequency determining network 5 or due to other causes, oscillation tends to cease and the magnitude of the voltage $E_1$ decreases. This reduces the excitation voltage applied to the variable impedance 6, which in turn reduces the impedance of the device 6. It is to be noted, that the voltage $E_2$ which is developed across the fixed impedance 7, is equal to $$\frac{Z_7}{Z_6+Z_7}(E_1)$$

Since the impedance $Z_6$ of the impedance device 6 varies in the same direction as the voltage $E_1$, the voltage $E_2$ does not experience as great a percentage reduction as does the voltage $E_1$. The positive feedback $E_2/E_1$ to the input terminal 4, therefore increases until unity loop gain is restored, and oscillation continues at this undesirable reduced level for the voltage $E_1$.

In order to provide a constant output signal $E_0$, according to the present invention additional circuitry is provided to establish the following relationship:

$$E_0=A(K_2E_2-K_1E_1)=A(K_2E_2'-K_1E_1')$$

where:

$E_1$ and $E_1'$ are the respective maximum and minimum output voltages at terminal 2 of the basic oscillator circuit over the frequency range of the oscillator.

$E_2$ and $E_2'$ are the voltages at terminal 9 corresponding respectively to the maximum and minimum voltages at terminal 2.

A is the gain of signal difference circuit 46;

$K_1$ is a constant provided by the transfer function of the amplitude adjust circuit 40; and $K_2$ is a constant provided by the transfer function of the amplitude adjust circuit 42. Then $$AK_2E_2-AK_1E_1=AK_2E_2'-AK_1E_1'$$

$$K_2(E_2-E_2')=K_1(E_1-E_2')$$

Now; $E_2-E_2'=\Delta E_2$ is the operational variation of the voltage $E_2$ over the frequency range of the oscillator; and $E_1-E_1'=\Delta E_1$ is the operational variation of the voltage $E_1$ over the frequency range of the oscillator, therefore, $$K_2\Delta E_2=K_1\Delta E_1$$

$$\frac{\Delta E_2}{\Delta E_1}=\frac{K_1}{K_2}$$

The above equations indicate, that an output $E_0$ can be produced at terminal 47 of difference circuit 46 which is independent of the variations of $E_1$ and $E_2$, and therefore is substantially constant over the full frequency range of the oscillator. This is accomplished by the circuit 46, which produces a signal which is a function of the algebraic difference between the voltage $E_1$, modified by the appropriate $K_1$ factor, and the voltage $E_2$ modified by the appropriate $K_2$ factor. The signal difference circuit 46 may for example, be a differential amplifier connected to produce a signal output whose amplitude is a function of the signal amplitude difference at its input terminals. A substantially constant output is therefore obtained although the percentage change of voltages $E_1$ and $E_2$ are different, since the ratio of the absolute changes in the voltages $E_1$ and $E_2$ is substantially constant.

In order to insure that a fixed value of $K_1$ and $K_2$ can be determined for a particular oscillator, it is preferable that the stabilizing feedback network possess a transfer function which does not change abruptly within the range of the oscillator's normal output voltage variation $\Delta E_1$. That is, the variable impedance element in the gain stabilizing feedback loop may have a linear or non-linear variation of impedance with applied signal, but preferably should not present abrupt change in transfer characteristic, in the region of expected variation of applied signal for a particular oscillator application.

It is to be understood, that the circuitry of FIGURE 4 may be simplified by elimination of one of the amplitude adjust circuits 40 or 42. That is, the factor $K_1$ or $K_2$ may be assumed to have a transfer gain of unity (1.0). Then the other of the K factors is made to have the appropriate gain of greater or less unity (1.0). For example, since in the embodiment of FIGURE 4 $\Delta E_2$ is always less than $\Delta E_1$, the ratio $K_1/K_2$ will be less than unity (1.0). This may be accomplished by making the factor $K_1=1.0$ and $K_2>1.0$, or $K_2=1.0$ and $K_1<1.0$, or any combination of $K_1$ and $K_2$ which produces the desired ratio which is less than 1.0. For purposes of simplicity and economy in the embodiment of FIGURE 4, the factor $K_2$ is preferably made 1.0, therefore the amplitude adjust circuit 40 may be, for example, a resistive divider circuit with a transfer gain of less than unity. The alternative ($K_1=1.0$), would require a device with a transfer gain greater than unity, such as an amplifier.

It has been observed when a bridged T oscillator, as shown in FIGURE 2, is used as the oscillator in the arrangement of FIGURE 4, the following variations of the voltages $E_1$ and $E_2$ were measured. The voltage $E_1$ varied between 11.5 and 9.15 voltages over the frequency range of 10 Hertz to 100,000 Hertz. This constitutes a range of variation of approximately 2 decibels. For the same circuit, the voltage $E_2$ varied from 2.7 to 2.33 volts over the same frequency range. Letting the factor $K_2=1$, the factor $K_1$ for the observed oscillator was calculated as:

$$K_1=\frac{E_2-E_2'}{E_1-E_1'}=\frac{2.7-2.33}{11.5-9.15}=0.158$$

With the amplitude adjust circuit 40 providing a transfer gain of 0.158, the voltage output $E_0$ from the signal difference circuit 46 was observed to have a variation about a desired value, of less than 0.1 decibel over the full frequency range of the oscillator.

What is claimed is:

1. In combination with an oscillator having a feedback device coupled to an output of said oscillator for feeding back a signal to control the gain of said oscillator, said feedback device including a first impedance and a second impedance at least one of which varies with applied signal; means for producing a substantially constant amplitude signal from said oscillator in response to the amplitude difference of the signal at said output and said feedback signal.

2. An oscillator having a signal dividing means coupled to an output of said oscillator, for feeding back a gain controlling signal to the input of said oscillator, said signal dividing means including a first impedance and a second impedance at least one of which varies with applied signal, comprising:

means responsive to a first signal representative of the amplitude of the output signal of said oscillator and to a second signal representative of the amplitude of said feedback signal for adjusting the amplitude of at least one of said first and second signals; and means coupled to said signal adjusting means for producing a second output signal in response to the amplitude difference between the first and second signals as modified by said signal adjusting means.

3. In combination with a variable frequency oscillator having a signal dividing means coupled between a first output of said oscillator and a point of reference potential, for providing a feedback signal to an input of said oscillator to control the gain of said oscillator, said signal dividing means including a first impedance and a second impedance one of which varies with applied signal, the improvement comprising:

signal difference means having at least two inputs providing a second output signal whose amplitude is proportional to the amplitude difference between the signals present at its inputs;

a first signal amplitude adjusting means responsive to the first output of said oscillator for providing a first input signal to said signal difference means;

a second signal amplitude adjusting means responsive to said feedback signal for providing a second input signal to said signal difference means; and said first and second inputs to said signal difference means being related by the equation $$K_1(E_1-E_1')=K_2(E_2-E_2')$$

wherein $E_1$ and $E_1'$ are the respective maximum and minimum signal amplitudes of the first output of said oscillator over the frequency range of said oscillator, $E_2$ and $E_2'$ are the corresponding signal amplitudes of said feedback signal over the frequency range of said oscillator, $K_1$ is a constant provided by the transfer function of said first signal amplitude adjusting means, and $K_2$ is a constant provided by the transfer function of said second signal amplitude adjusting means.

4. In combination:

a variable frequency oscillator having a first feedback path including means for determining the frequency of oscillation of said oscillator;

a second feedback path between a first output of said oscillator and an input to said oscillator for feeding back a gain controlling signal, said second feedback path having a signal dividing means including a fixed impedance and an impedance that varies with applied signal;

amplitude adjusting means responsive to the signal at said first output and said gain controlling feedback signal, for providing second and third output signals having a desired amplitude ratio between said signals; and means responsive to said second and third output signals for producing a fourth output signal whose amplitude is essentially constant over the frequency range of said oscillator, in response to the amplitude difference between said second and third output signals.

5. The device as claimed in claim 4, wherein; said variable frequency oscillator is a bridged T oscillator.

6. The device as claimed in claim 4, wherein; said variable frequency oscillator is a Wien bridge oscillator.

7. The device as claimed in claim 4, wherein; said amplitude adjusting means includes a resistive divider network.

8. The device as claimed in claim 4, wherein; said amplitude adjusting means includes an amplifier.

9. The device as claimed in claim 4, wherein; the means responsive to said second and third output signals, is a circuit which produces a signal whose amplitude is a function of the algebraic difference between the amplitudes of said second and third output signals.

10. The device as claimed in claim 9, wherein; the circuit, for producing a signal in response to the amplitude difference of said second and third output signals, is a differential amplifier.

References Cited

UNITED STATES PATENTS

| | | | |
|---|---|---|---|
| 2,276,643 | 9/1956 | Sulzer | 331—183 X |
| 2,930,992 | 3/1960 | Rawlins et al. | 331—141 |
| 3,339,156 | 8/1967 | Niedereder | 331—183 X |

ROY LAKE, Primary Examiner

SIEGFRIED H. GRIMM, Assistant Examiner

U.S. Cl. X.R.

331—141, 183